United States Patent [19]
Robinson et al.

[11] Patent Number: 5,313,128
[45] Date of Patent: May 17, 1994

[54] LEAD WIRE ELIMINATION FOR ENCLOSED SPINDLE MOTOR

[75] Inventors: Peter G. Robinson, Capitola; James S. Bowdoin, Santa Cruz; Robert A. Nottingham, Capitola, all of Calif.

[73] Assignee: Seagate Technology, Inc., Scotts Valley, Calif.

[21] Appl. No.: 12,897

[22] Filed: Feb. 3, 1993

[51] Int. Cl.5 .................. H01B 07/08; H02K 15/00
[52] U.S. Cl. .................................. 310/71; 310/42; 310/DIG. 6; 174/117 A
[58] Field of Search .............. 310/71, 72, 218, 254, 310/DIG. 6, 68 R; 174/117 A, 258, 259, 268

[56] References Cited

U.S. PATENT DOCUMENTS

| | | | |
|---|---|---|---|
| 3,270,122 | 8/1966 | Binek | 174/117 F |
| 4,661,733 | 4/1987 | Heyraud | 310/68 R |
| 4,724,346 | 2/1988 | Klein et al. | 310/67 R |
| 4,870,311 | 9/1989 | Chase et al. | 310/232 |
| 4,931,598 | 6/1990 | Calhoun | 174/117 F |
| 5,023,734 | 6/1991 | Tanaki | 360/84 |
| 5,031,061 | 7/1991 | Hatch | 360/98.07 |
| 5,097,366 | 3/1992 | Veki et al. | 360/97.02 |

*Primary Examiner*—Emanuel T. Voeltz
*Assistant Examiner*—D. R. Haszko
*Attorney, Agent, or Firm*—Flehr, Hohbach, Test, Albritton & Herbert

[57] ABSTRACT

In summary, the present invention is a flexible printed circuit that eliminates the need for lead wire routing. The flexible printed circuit of the present invention comprises a plurality of electrical paths surrounded by a sheath of pliable MYLAR (polyester film) plastic. One side of the plastic is an adhesive that holds the circuit in place after it is wrapped around the shaft of the motor. On the other side, the mylar sheath opens to expose the ends of each electrical path. Small amounts of solder are pre-deposited at these exposed ends. A probe, suitably heated and applied to these ends, releases the solder to form a electrical and physical contact.

6 Claims, 6 Drawing Sheets

LEAD WIRE ELIMINATION FOR ENCLOSED SPINDLE MOTOR

BACKGROUND OF THE INVENTION

1. Field of the Invention.

The present invention relates generally to the fabrication of spindle motors used primarily in disc drives and, more particularly, to the use of a flexible printed circuit in the construction of an enclosed spindle motor.

2. Prior Art.

Disc drives are a common means of providing secondary storage in computer systems. Disc drives generally consist of a plurality of vertically aligned magnetic media discs that store data thereon. Over the surface of each disc, a read/write head provides access to the stored data. In a typical access, the head is positioned by a motor some radially distance from the center of the disc. The discs are caused to rotate underneath the head; thereby giving access to the entire circumference of the disc.

The rotation of the discs is usually accomplished by way of a spindle motor. Spindle motors generally consist of a stator assembly defined by a number of poles radiating perpendicularly out from a shaft. Conducting wire is wound around each pole to provide the necessary electromotive force to the motor when the correct current is applied. In a three phased, nine-pole spindle motor, three separate wires are wound around the stator poles—one wire for three poles of the stator.

Spindle motors may be placed into two broad categories: enclosed or cantilever/hub type spindle motors. In an enclosed spindle motor, a separate housing covers the stator assembly and defines an opening for the shaft to rise out of the housing. By comparison, a cantilever/hub type motor is not totally enclosed. Instead, the stator assembly is partially exposed to view.

Wiring a spindle motor is typically a two-step process: first, the coil wires are wound around the poles, leaving a start and finish end to each wire; the ends of which are usually soldered to lead wires. These lead wires are then routed away from the stator to be electrically mated to outside circuitry., Typically, the winding of the coil wire is an automated process. In a 9-pole, 3-phase spindle motor, one continuous length of wire is wrapped around three adjacent poles by a dedicated winding machine. This dedicated machine leaves the ends of the windings at various, predetermined angular displacements around the stator.

The mating and routing of lead wires is usually a manual process. Lead wires are manually soldering to the winding ends. Once soldered, the lead wires are manually routed out of the stator assembly to become electrically connected to outside circuitry. Outside circuitry typically controls the current flow through the windings to produce the proper phase relations.

The manner in which lead wires are routed differs depending on whether the spindle motor is an enclosed or a cantilever/hub type motor. For a cantilever/hub type spindle motor, the task of routing is less difficult. Because the stator assembly is not fully enclosed, the lead wires may be routed from the various angular displacement after the automated winding process. As discussed further below, flexible printed circuit have been used to provide electrical connection between the lead wires and outside circuitry in cantilever/hub type motors.

For enclosed spindle motors, lead wire routing is more involved. Since the stator assembly is enclosed in a housing, the lead wires are typically brought together at one given angular position around the stator and lead up along the shaft through the opening of the housing. Once outside the housing, the lead wires are then soldered to outside circuitry.

Several problems are introduced by the manual routing of enclosed spindle motors. First, the manual process is labor intensive and adds to the cost of manufacture of enclosed spindle motors. Savings could be realized if the soldering and routing could either be automated or simplified.

Second, the manual routing of lead wires to a common angular position adds some error to the control of the motor. The dedicated winding machine provides a standard number of windings per pole, typically 30 such windings. Routing extra lead wires around stator creates a resistance imbalance because the length of the different lead wires varies. This resistance imbalance creates an imbalance in the phase relations for the motor; and hence, in the angular velocity of the motor. Ultimately, the storage density of the discs is decreased because variations in the angular velocity of the motor drive may overload the capacity of the head to read or write data.

It is the object of the present invention to provide a means to eliminate the need for manually routing the ends of the windings to lead wires.

It is a further object to eliminate the need for manual solder joints involved in the soldering of winding ends to the lead wires and in the soldering the lead wires to an outside circuit.

It is yet a further object to decrease the error due to phased resistance imbalance that introduced by manual routing.

SUMMARY OF THE INVENTION

In summary, the present invention is a flexible printed circuit that eliminates the need for lead wire routing. The flexible printed circuit of the present invention comprises a plurality of electrical paths surrounded by a sheath of pliable MYLAR (polyester film) plastic. One side of the plastic is an adhesive that holds the circuit in place after it is wrapped around the shaft of the motor. On the other side, the mylar sheath opens to expose the ends of each electrical path. Small amounts of solder are pre-deposited at these exposed ends. A probe, suitably heated and applied to these ends, releases the solder to form a electrical and physical contact.

In the presently preferred embodiment, the flexible printed circuit is T-shaped. The base of the T wraps around the shaft. The electrical paths have openings at the base of the T and connect with winding ends. The circuit is designed so that the paths are proximate to the ends after the circuit is secured to the shaft. No manual routing of the winding ends is required. To electrically mate the windings to the circuit paths, it is sufficient to hold the winding ends to the path ends and apply the requisite amount of heat to the solder.

The other portion of the T-shaped circuit narrows to fit longitudinally along the shaft of the motor. In the presently preferred embodiment, the shaft has a slot on its side that defines a narrow pathway away from the stator when the motor is eventually enclosed. The top of the T-shape comprises a contact pad for the electrical paths. At final assembly, this pad is folded over onto the surface of another flexible printed circuit and the pad is soldered by the application of a heating probe.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
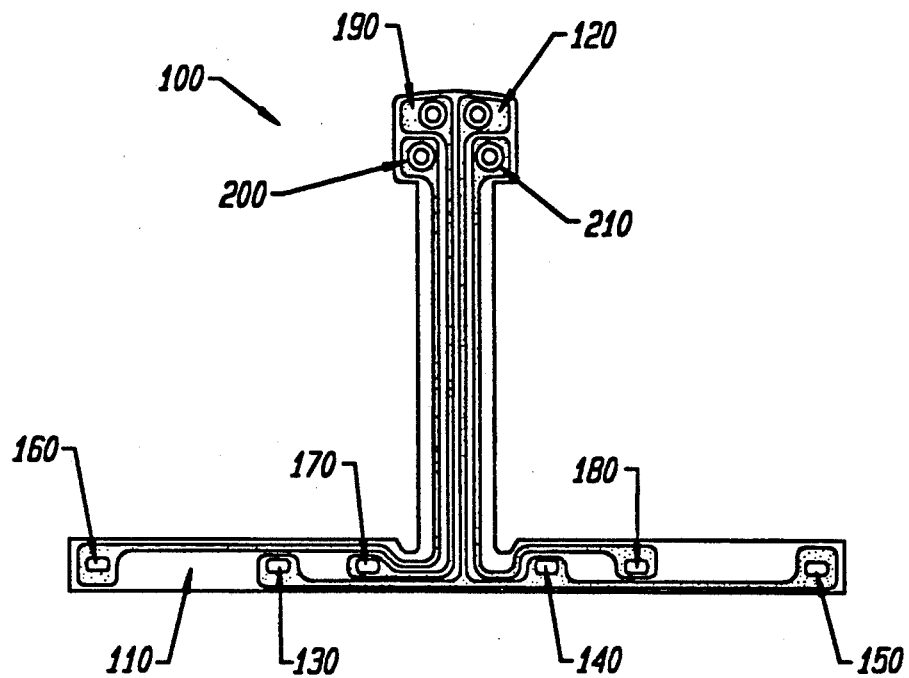
FIG. 1 shows an embodiment of the flexible printed circuit constructed in accordance with the principles of the present invention.

Referring to FIG. 1, flexible printed circuit 100 is depicted in accordance with the principles of the present invention. Circuit 100 is shown with four electrical paths, each starting at contacts 120, 190, 200, and 210. These paths are sheathed in insulator 110. Insulator 110 is made of a flexible mylar plastic in the presently preferred embodiment. It should be appreciated that any suitably flexible insulating material will suffice and the use of mylar plastic should not be construed as a limitation on the present invention.

Circuit 100 is essentially constructed in a T-shape. As discussed below, the T-shape facilities the final assembly of an enclosed spindle motor. One side of circuit 100 has an adhesive coating (not shown) that allows circuit 100 to adhere to the shaft of the stator. The other side of circuit 100 has openings in insulator 110 for contacts 120, 130, 140, 150, 160, 170, 180, 190, 200, and 210.

These openings expose the conducting surface of the contacts to provide electrical and physical mating. Proximate to the openings, a small amount of solder (not shown) is predeposited. As discussed below, predeposited solder eases the soldering process by reducing the amount of manual labor involved in construction of an enclosed spindle motor.

It will be appreciated that circuit 100 could be constructed with either more or less electrical pathways than the four pathways depicted and that the particular number of paths should not be construed as a limitation on the present invention. Additionally, the adhesive backing deposited on circuit 100 is one of many possible means of securing circuit 100 to the shaft of the stator and should not be construed as a limitation.

Figure 2:
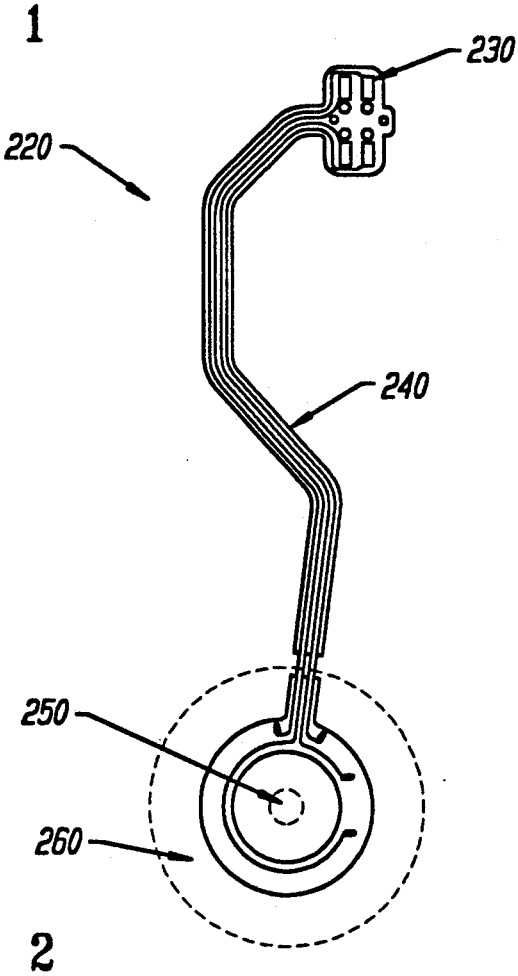
FIG. 2 shows a prior art embodiment of a flexible printed circuit that used on a cantilever hub-type motors.

The T-shaped design of circuit 100 stands in contrast to other flexible printed circuits practiced in the prior art. FIG. 2 shows flexible printed circuit 220 currently used on non-enclosed, cantilever hub motor 260. Circuit 220 has pathway 240 that connects to motor 260 in a circular fashion surrounding shaft 250. Contact pad 230 electrically connects motor 260 to outside circuitry.

Because motor 260 is not enclosed, there is no pressing need to design circuit 220 in any shape that facilitates a close fit to shaft 250. Indeed, pathway 240 protrudes perpendicularly from shaft 250. To work in an enclosed motor, the stator assembly housing would have to have a separate opening to accommodate circuit 220.

Figure 3:
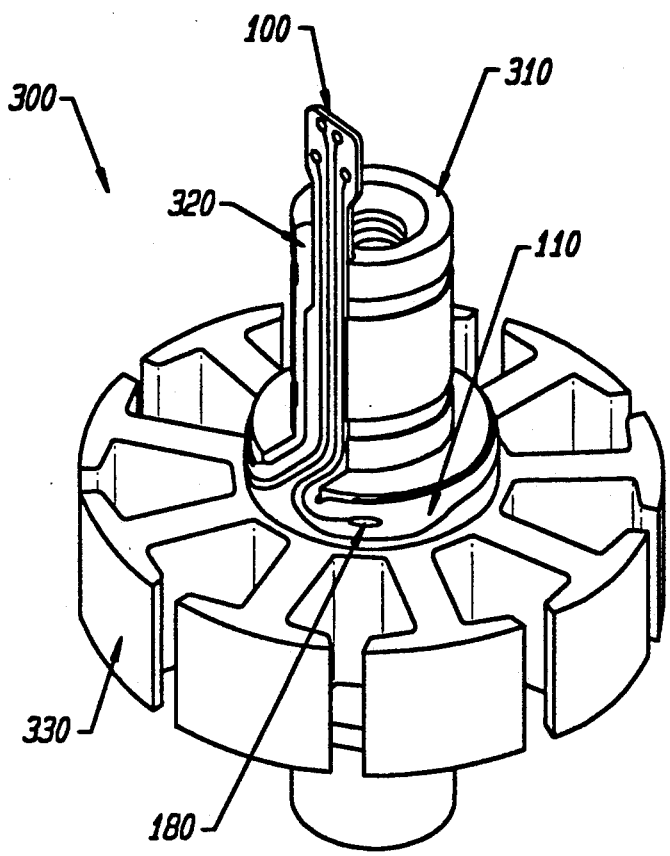
FIG. 3 is a perspective view of the flexible printed circuit as it appears when affixed to the stator and shaft.

FIG. 3 shows flexible printed circuit 100 attached to stator assembly 300 in accordance to the principles of the present invention. In the presently preferred embodiment, assembly 300 comprises nine-pole stator 330 and shaft 310, running perpendicularly through stator 330. Shaft 310 defines slot 320 which provides an pathway for circuit 100 when the assembly 300 is enclosed.

Nine-pole stator 330 supports three windings (not shown in FIG. 3). Each winding wire is wrapped around three separate poles. Normally, a dedicated machine automatically winds the wires around the poles. The ends of the windings are scattered at various angular positions about shaft 310. However, because the process is automated, the angular positions are constant, that is the ends are always located in the same position about shaft 310. As discussed below, the present invention takes advantage of this positional regularity.

It should be appreciated that the number of poles in the stator assembly, as well as the number of winding wires and number of poles per winding wire used in the presently preferred embodiment, is arbitrary and should not be construed as a limitation on the invention.

The construction of the enclosed spindle motor will now be described. As shown in FIG. 3, circuit 100 is secured around shaft 310 by an adhesive backing (not shown) deposited on one side of its surface. The other side of circuit 100 holds the contacts, such as contact 180. Insulator 110 is opened at the contacts to provide electrical and physical coupling. Circuit 100 is designed so that its contacts are always proximate to the winding ends whose positions are regularly provided by the automatic winding process. It will be appreciated that additional lead wire is not needed to form a pathway from the winding ends out of the housing of the enclosed motor.

To electrically and physically mate the windings to circuit 100, the ends of the windings are physically placed on its designated contact point and a heat probe is applied to the point, thereby releasing its predeposited solder. Predeposited solder reduces the amount of manual labor required because a technician need not hold a separate strand of solder while holding winding end to the contact and applying a heat probe.

Figure 4:
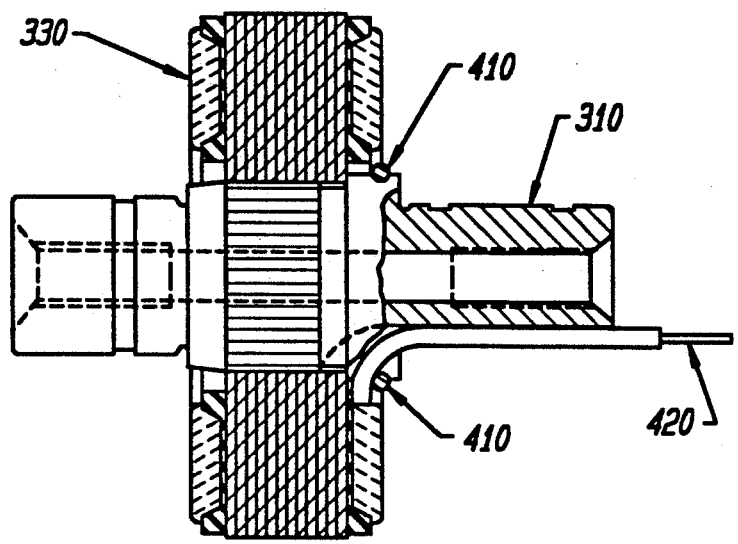
FIG. 4 is a cross-sectional view of an enclosed spindle motor employing the prior method of manually routed lead wires.

The elimination of lead wires also obviates the need for manually routing the individual lead wires around shaft 310 and up along a central pathway, as depicted in FIG. 4. FIG. 4 is a cross-sectional view of stator 330 using lead wires 420 to electrically mate windings to outside circuitry, as practiced in the prior art. Lead wires 420 are typically soldered individually to the winding ends and manually wrapped around shaft 310 to a common exit point up shaft 310. To hold individual lead wires 420 in place, clip 410 was wrapped around shaft 310; thus, pinching wires 420 to shaft 310.

Figure 5:
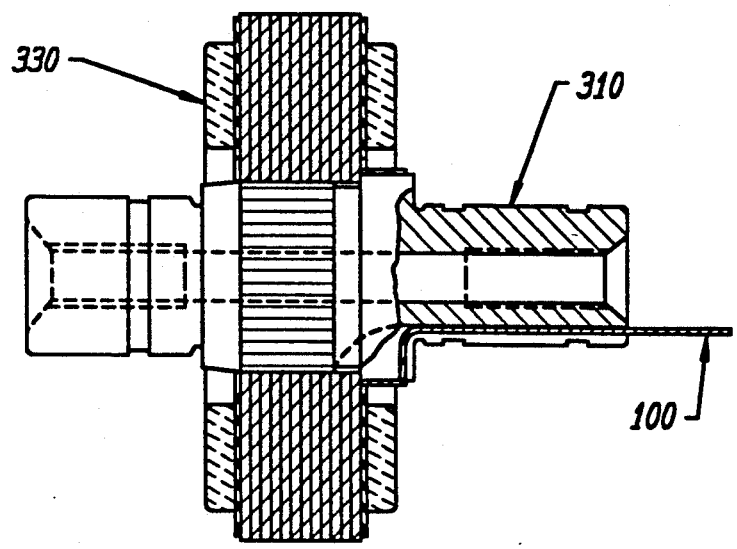
FIG. 5 is a cross-sectional view of a stator assembly employing the flexible printed circuit in accordance with the principles of the present invention.

By contrast, FIG. 5 is a cross-sectional view of stator 330 using flexible printed circuit 100 made in accordance with the principles of the present invention. As noted above, there is no need in the present invention to manually route individual lead wires up along shaft 310. It will also be appreciated that the present invention obviates the need for clip 410 to hold circuit 100 in place.

Figure 6A:
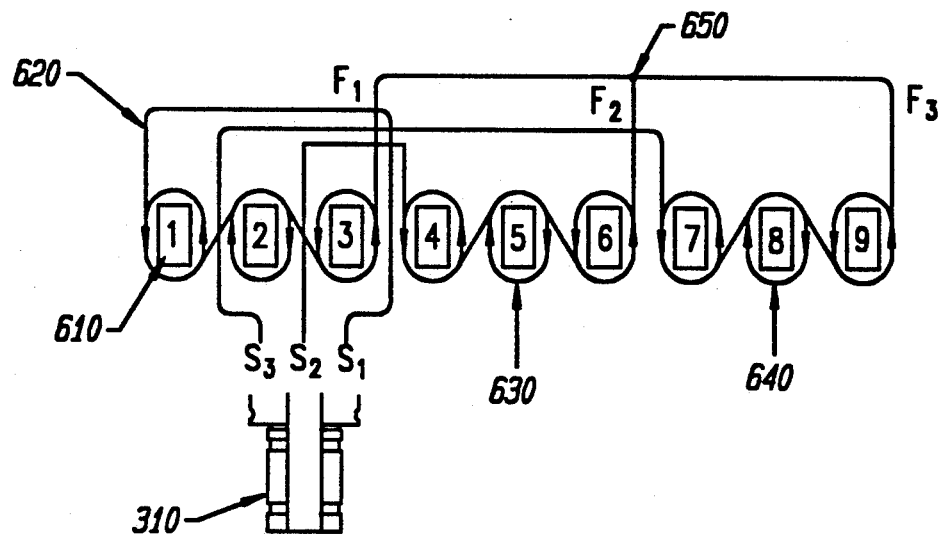
FIG. 6A is a flat representation of the poles of the stator and their windings employing manually routed lead wires.

An additional advantage of the present invention over the use of lead wires is a decrease in error due to phased resistance imbalance. FIG. 6A is a flat representation of the poles and their windings using manual lead wire routing. Three wires 620, 630, and 640 are wound around poles 610. Each wire has a start and a finish ending, depicted as $S_1$, $S_2$, $S_3$, and $F_1$, $F_2$, $F_3$ respectively. The finish endings are twisted and terminated at common point 650. The start endings are manually routed up shaft 310.

FIG. 6A shows the need for variable lengths of wire to connect the different windings to the start endings $S_1$, $S_2$, and $S_3$. By tracing wire 640 from the point labelled $S_3$ to pole 7, it can be seen that wire 640 traverses poles 2, 3, 4, 5 and 6. This traversal of poles adds to the overall length of wire 640. Similarly, additional wire is needed for paths labelled 620 and 630 to traverse poles to arrive at the starting points. Because the separate lengths of additional wire are different for wires 620, 630, and 640, the total resistance along these wires are different. It is the difference in resistance along these wires that causes a phase imbalance in the currents along these wires. This imbalance is ultimately undesirable because it causes positioning error in the rotation of the storage discs. Consequently, the potential storage density on the storage discs is decreased.

Figure 6B:
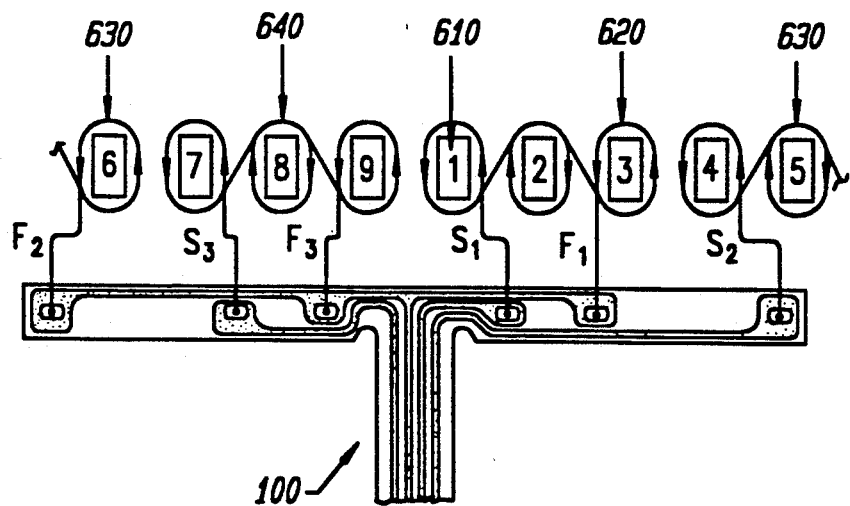
FIG. 6B is a flat representation of the poles of the stator and their windings employing the flexible printed circuit.

FIG. 6B is a flat representation of poles and their windings as practiced in the presently preferred embodiment. Wires 620, 630, 640 are identical to the wires depicted in FIG. 6A except that their endings are mated to circuit 00. FIG. 6B shows that circuit 100 does away with the need for additional lead wire. It will be appreciated that the lengths of wires 620, 630, and 640 are identical and the phase imbalance due to variable resistance is avoided. Thus, circuit 100 allows for greater accuracy in the control of the spindle motor and a greater storage density per disc is consequently possible.

It will be appreciated that the finish endings, $F_1$, $F_2$, and $F_3$, are electrically mated together since their contact points are located on the same electrical path. Start endings have their own separate electrical path that will be electrically connected to outside circuitry.

Figure 7:
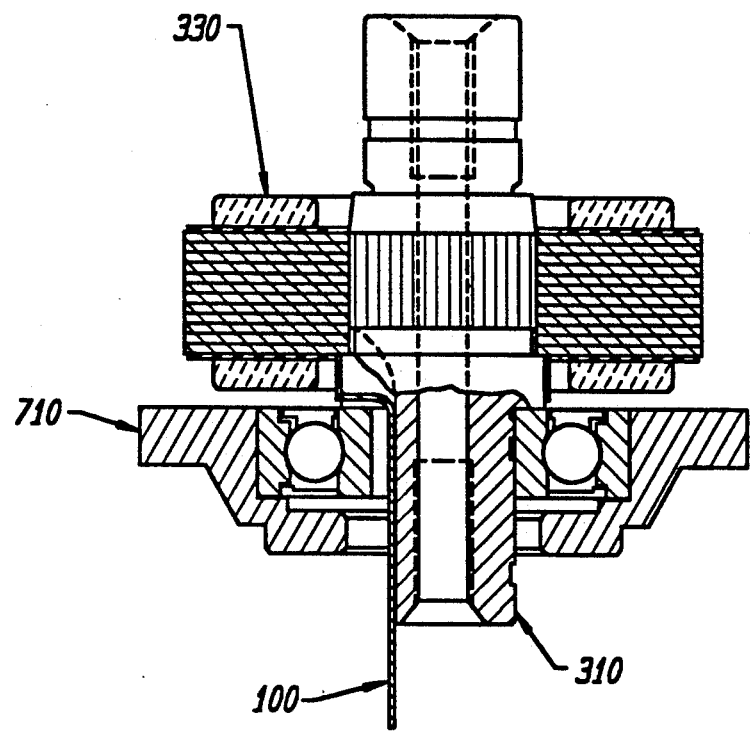
FIG. 7 is a cross-sectional view of a stator assembly with flexible printed circuit after the assembly is enclosed.
Figure 8:
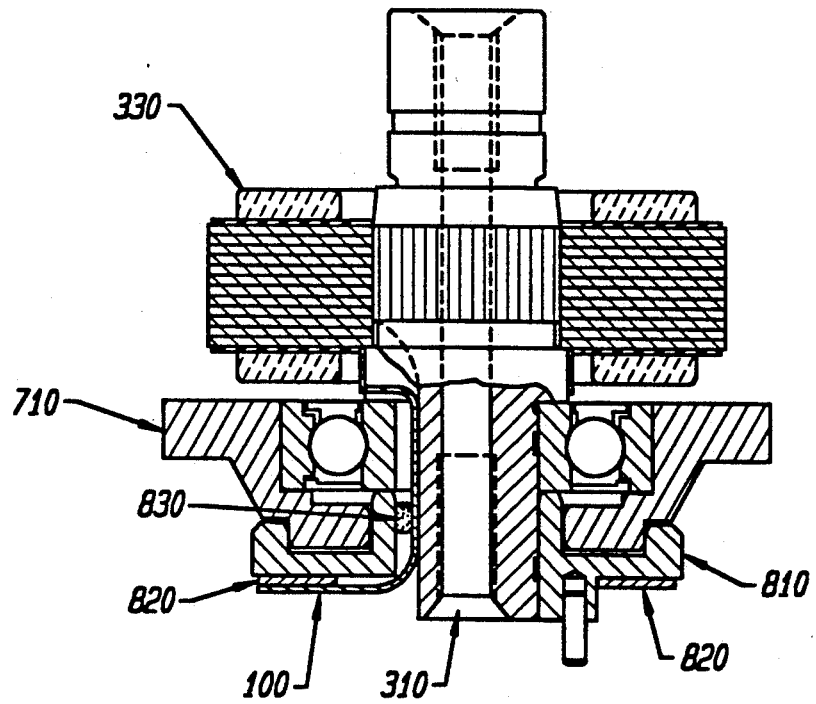
FIG. 8 is a cross-sectional view of the enclosed motor mated to an outside assembly having a separate flexible printed circuit.

The final assembly of the enclosed spindle motor will now be described. FIG. 7 is a cross-sectional view of stator 330 with circuit 100 after housing 710 encloses the stator. It will be noted that circuit 100 rides securely up shaft 310 to provide electrical connection to outside circuitry. FIG. 8 is a cross-sectional view of spindle motor after bushing 810 is mated to the assembly in FIG. 7. Separate flexible printed circuit 820 surrounds bushing 810 and provides electrical connection to outside control circuitry. Flexible printed circuit 100 is shown as bent over and mated, both physically and electrically, to circuit 820. The contacts on the top of circuit 100 also contain predeposited solder and soldering is accomplished by applying a heat probe to the contacts. Plug 830 is used to reduce air flow from the interior of motor to the exterior. The prior art teaches the use of adhesive; elimination of adhesive is highly desirable to avoid contaimination of the HDA.

Figure 9:
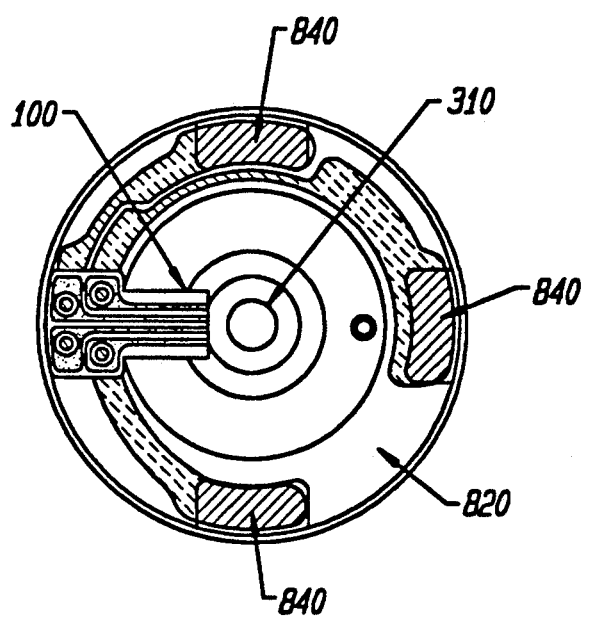
FIG. 9 is an overhead view of the enclosed motor mated to an outside assembly having a separate flexible printed circuit.

FIG. 9 is a top view of stator assembly as depicted in FIG. 8. FIG. 9 shows in greater detail the manner in which circuit 100 is mated to circuit 820. The top of the T-shaped circuit 100 is bent so as to make contact with corresponding electrical contact on circuit 820. In the presently preferred embodiment, circuit 820 is made of the same mylar plastic that circuit 100 is made. Contacts 840 are formed by openings in the mylar sheath of circuit 820. These contact, in turn, make physical and electrical connections with the requisite outside circuitry.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. An apparatus for electrically mating respective starting ends and finishing ends of a plurality of windings of a stator assembly to outside circuitry, said stator assembly having a plurality of poles and a shaft, and said stator assembly being enclosed within a housing defining a housing opening for said shaft, said apparatus comprising:

a plurality of electrical paths;

a sheath of flexible insulating material substantially surrounding said electrical paths as a unit, and having a base portion extending circumferentially around a portion of said shaft and an elongated portion formed to fit along said shaft when said housing encloses said stator assembly, said elongated portion defining circuitry openings for each electrical path proximate one end thereof to provide electrical connection to said outside circuitry, and said base portion defining at least one winding end opening for each electrical path spaced along said base portion to provide electrical connection with each of the starting ends and finishing ends of each of said windings, said winding end openings further being circumferentially spaced-apart about said base portion and relative said shaft such that the lengths of each winding between respective winding starting ends and respective winding finishing ends are substantially equal;

a means for securing said base portion and said elongated portion to said shaft.

2. The apparatus of claim 1 wherein said sheath of insulating material consists essentially of flexible plastic.

3. The apparatus of claim 1 wherein said means for securing comprises an adhesive backing on one side of said sheath.

4. The apparatus of claim 1 wherein said sheath further comprises at least a first side and a second side, said means for securing affixed to said first side and said second side defining said circuitry openings and said winding end openings for each said path.

5. The apparatus of claim 1 wherein said sheath is substantially T-shaped.

6. The apparatus of claim 1 further including pre-deposited solder disposed proximate each said circuitry opening and each said winding end opening.

* * * * *